US 6,574,779 B2

(12) United States Patent
Allen et al.

(10) Patent No.: US 6,574,779 B2
(45) Date of Patent: Jun. 3, 2003

(54) HIERARCHICAL LAYOUT METHOD FOR INTEGRATED CIRCUITS

(75) Inventors: Robert J. Allen, Jericho, VT (US); John M. Cohn, Richmond, VT (US); Steve G. Lovejoy, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 09/833,479

(22) Filed: Apr. 12, 2001

(65) Prior Publication Data
US 2002/0194575 A1 Dec. 19, 2002

(51) Int. Cl.[7] ............................................. G06F 17/50
(52) U.S. Cl. ................... 716/1; 716/12; 716/17
(58) Field of Search ................. 716/1, 4, 5, 7, 716/12, 17

(56) References Cited

U.S. PATENT DOCUMENTS

| | | | |
|---|---|---|---|
| 4,554,625 A | 11/1985 | Otten | 364/148 |
| 5,187,671 A | 2/1993 | Cobb | 364/490 |
| 5,325,309 A * | 6/1994 | Halaviati et al. | 364/488 |
| 5,471,398 A | 11/1995 | Stephens | 364/490 |
| 5,551,014 A * | 8/1996 | Yoshida et al. | 716/11 |
| 5,633,807 A | 5/1997 | Fishburn et al. | 364/491 |
| 5,712,793 A | 1/1998 | Scepanovic et al. | 364/490 |
| 5,867,395 A * | 2/1999 | Watkins et al. | 716/18 |
| 5,898,595 A | 4/1999 | Bair et al. | 364/491 |
| 5,905,669 A | 5/1999 | Horita | 365/51 |
| 5,910,899 A | 6/1999 | Barrientos | 364/491 |
| 5,930,499 A | 7/1999 | Chen et al. | 395/500.09 |
| 5,963,730 A | 10/1999 | Toyonaga et al. | 395/500.09 |
| 5,974,244 A | 10/1999 | Hayashi et al. | 395/500.09 |
| 5,984,510 A | 11/1999 | Guruswamy et al. | 364/491 |
| 5,995,734 A | 11/1999 | Saika | 395/500.1 |
| 6,009,251 A | 12/1999 | Ho et al. | 395/500.06 |
| 6,058,252 A * | 5/2000 | Noll et al. | 716/10 |
| 6,066,178 A | 5/2000 | Bair et al. | 716/2 |
| 6,167,555 A * | 12/2000 | Lakos | 716/3 |
| 6,418,551 B1 * | 7/2002 | McKay et al. | 716/5 |
| 6,425,113 B1 * | 7/2002 | Anderson et al. | 716/5 |

* cited by examiner

Primary Examiner—Don Wong
Assistant Examiner—Shih-chao Chen
(74) Attorney, Agent, or Firm—McGinn & Gibb, PLLC; Richard M. Kotulak, Esq.

(57) ABSTRACT

A method for hierarchical layout of an electronic design using an electronic computer aided design system, wherein the method includes generating a parameterized pattern library and using an existing netlist and analyze in a pattern recognizer, from which a list of associations between the pattern library and the netlist is created. Renesting then occurs wherein the netlist using the list of associations is used for generating a hierarchical layout of the electronic components in the design.

28 Claims, 3 Drawing Sheets

HIERARCHICAL LAYOUT METHOD FOR INTEGRATED CIRCUITS

BACKGROUND OF THE INVENTION

1. Field of the Invention

The present invention generally relates to computer-aided design and in particular to a hierarchical layout method for integrated circuits.

2. Description of the Related Art

All integrated circuits and their physical packaging are described by physical designs in the form of hierarchical two-dimensional geometric models. Hierarchical characterization is typically used to define the wiring channels and connection ports that can be used to route wire over a design partition in the higher level cell. The complexity of these designs quadruples every couple of years. This increasing data volume is becoming a significant problem for engineering design automation, since it stresses software design systems which in turn impact the design cycle time, design cost and time to market.

The input to the physical design problem is a circuit diagram, and the output is generating a layout of the integrated circuit. Well-known techniques for implementing a physical design include a combination of steps that include partitioning, floor planning, routing, compaction, parasitic extraction, and proper timing in an iterative sequence to form a design process commonly known as the top-down design methodology. The output of partitioning is a set of blocks, along with the interconnections required between blocks. The set of interconnections required is referred to as a "netlist," which is a compilation of information descriptive of the primitives (i.e., circuit elements) of a logic circuit. "Netlist" can also be a cell description (a group of circuit elements) and their interconnection.

Present electronic design systems consist of software tools running on a digital computer that assist a designer in the creation and verification of complex electronic designs. Electronic computer-aided design (ECAD) systems are widely used in designing semiconductor integrated circuits. In particular, ECAD systems are used to generate data descriptive of the entire circuit layout as well as the layout of individual circuit cells. Since each cell often contains a large number of circuit elements and interconnections among the elements, ECAD systems have become an indispensable tool in the design of integrated circuits. In addition to generating layout design, some types of ECAD systems generate mask pattern data using circuit layout data. Mask pattern data is used to control various exposure processes necessary for the integrated circuit's manufacture.

Known techniques for generation of layouts of integrated circuits include: a) manual layout; b) hierarchical standard-cell with general place/route method, which requires pre-existing layouts for each of the devices; and c) parameterized leaf-cell with general place/route method, which generates the cells. The latter two methods are "schematic-driven" in that the leaf-cells of the layout correspond to a single node in the schematic netlist. In each of these methods, the resulting components (hierarchically structured layouts) are located and wired using an ECAD system for placement and routing of wiring to complete the connections indicated in the netlist.

However, these hierarchically structured layouts are generated for preliminary analysis of the IC layout placement, and not as a final IC layout placement that is typically generated automatically prior to the optional routing and compacting processing. To illustrate this problem, a designer typically "explodes" the logic elements used in a circuit, and examines a direct transistor-level netlist. As such, current placement layout methods require either manual layout which requires a great increase in effort relative to automated placement or generation of individual transistor layouts. Such manual modification is labor intensive and error prone. Use of a general placement present problems that include transistors being larger in size. Also, it is more difficult to achieve an optimal design with general placement since automated transistor design tools are not as sophisticated as standard-cell based tools. Further, there are other method or technical constraints posed by the general placement layout (e.g., embedded latches or SRAM cells are typically selected from a pre-existing library, rather than use of custom cells). In summary, the above problems in connection with current placement layout methodologies are costly and time consuming.

SUMMARY OF THE INVENTION

A primary object of the present invention is to provide a method for applying a set of schematic sub-graph recognition rules, (e.g., pattern matching rules, logical analysis) to create an intermediate "renested" schematic to direct a layout generation system during design of an IC chip. In the invention, the term "renest" is equivalent in meaning to "nesting" depending upon whether preliminary designs are used prior to providing a structured netlist for the layout generation system. The invention allows for the transforming of a flat schematic into a nested (e.g. hierarchical) schematic to provide automatic generation of a layout without the need for manual intervention, yielding optimized context-sensitive of layouts (i.e., a differentiation of occurrences of the same cells in the netlist) of assembled IC components.

Generation of a parameterized pattern library include steps of initially selecting a list of applicable layout generators (e.g, type of topological design element such as a NOR gate, NAND gate or inverter cells). For each selected layout generator, a schematic pattern is created describing a rule for generating a netlist for a specific instance of the layout. The pattern includes a netlist topology and parameters for the nodes (e.g., transistors) of the netlist that are calculated as mathematical expressions of the parameters for that generator. From this pattern, a matching criteria and parameter derivation rules are calculated. The pattern recognition for this generator includes the required topology with matching criteria. Finally, the step of "renesting" the netlist includes substituting a recognized topological subgraph with a node representing the layout generator, with parameters as calculated by the parameter derivation rules (when the topological subgraph match the requisite topology and pass the matching criteria).

Another object of the invention is to provide a computer implementation of the method for hierarchical layout of an electronic design, wherein the method includes creating a parameterized pattern library that includes layout generators of elements forming part of the design, followed by inputting a netlist into a pattern recognizer using the parameterized pattern library. Next, a list of associations is created between the parameterized pattern library and the netlist using the pattern recognizer. Then the netlist is renested using the list of associations resulting in generating a hierarchical layout of the electronic components.

Renesting the schematic netlist by the pattern recognizer by initially creating a parameterized pattern library of the components used enables greater productivity in layout generation when compared to conventional manual transistor-level layout. The invention also facilitates in revisions of the layout that frequently occur in response to functional or performance tuning where iterations of preliminary designs are necessary. In addition, the invention aids the eventual migration of a design to subsequent generation of VLSI technology (e.g., from a 0.25 μm process to a 0.18 μm process).

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
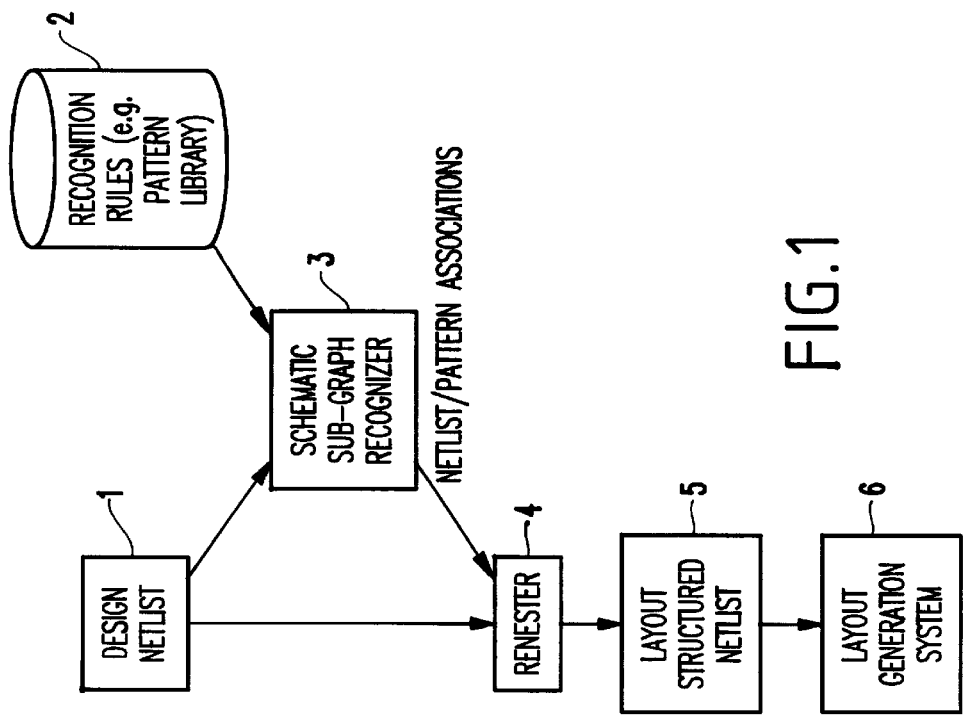
FIG. 1 is a high level representation of the layout generation system of the present invention.

The present invention provides a method for integrated circuit (IC) design layout generation. A physical design is a set of mask shapes that denote the design of an integrated circuit. Within the physical design, a shape is a planar set of points and the bounding edges they define. The physical design of an integrated circuit is expressed in the form of a hierarchical layout, which consists of duplicate instances of basic design components connected together to form a complex design. The hierarchical layout characterizes the design as nested data, where design components are retained embedded as much as possible in the design. In contrast to nested data, flat or flattened design data has all of its shapes transformed to the highest level of the design, and thus expressed in a non-hierarchical flat form. The invention described below automates the nesting process by applying recognition rules to the non-hierarchical, flat layout to automatically modify the flat layout into a context-sensitive layout.

In other words, the invention provides an automated, non-manual process/system that reviews the flat, non-hierarchical design to determine if it can match portions of the flat design to known groups of elements contained in a parameterized pattern library 2. Further, an important feature of the invention is that the parameterized pattern library 2 is generated without knowledge of the specific circuits that will be nested. To generate such a library, the invention creates unique reverse derivation rules for each group of elements that are used by each parameterized layout generator (each layout generator is specific to a logic unit, such as AND, OR, etc.). The invention formulates mathematical expressions (based on the layout generators parameters) that the layout generator would use when "flattening" (e.g., eliminating the hierarchy) a logic unit (AND, OR etc.) into an actual physical layout. The invention then inverts these mathematical expressions to allow the library to be used to identify higher level logical units from a flat schematic layout.

More specifically, generation of the parameterized pattern library 2 includes selection of a list of layout generators. For each layout generator, the invention inputs a schematic pattern describing a flattening rule for generating a transistor level netlist pattern element (e.g., a NAND, an inverter, a MUX, etc.). The schematic pattern consist of a netlist topology (e.g., wiring connections etc.) and parameters for the nodes of a transistors of the netlist. The netlist are used for calculating mathematical expressions of the parameters of each of the layout generators used. From this pattern, a matching criteria is calculated (e.g., required "p/n" type transistor ratios, equality between different parameters, min/max bounds on parameters). Also from this pattern, parameter derivation rules are then calculated (e.g., generator parameter PW=parameter "w" of transistor that matches node "P" in pattern topology). The recognition pattern used by the recognizer 3 for this selected generator includes the required topology together with the associated matching criteria (MC) for this layout generator.

If the pattern from the parameterized library determines proper matching during pattern recognition using MC, the renester replaces that group of elements with a single node in the flat design. The invention proceeds throughout the flat design and replaces groups of elements with single nodes wherever possible. The result is a hierarchical layout that can be used by the layout generator to prepare the actual physical integrated circuit layout. The invention is advantageous when compared to conventional systems because electrical equivalents (or near equivalents) of the design that is restructured that is more amenable to layout generation.

Referring now to FIG. 1, a high level representation implemented by a layout generation system using the invention is shown. A netlist 1 is initially provided starting the layout process, wherein the invention transforms a flat schematic into a nested schematic to provide automatic non-manual layout during the placement processing of an IC chip, yielding optimized context-sensitive layouts (i.e., a differentiation of occurrences of the same cells in the netlist) of assembled components. The invention selects and applies patterns based on layout capabilities (e.g., which cell-library elements or layout generators are available). These patterns are matched using one of several accepted methods such as that disclosed in Orlich et al. article entitled, "SubGemini: Identifying SubCircuits Using a Fast Subgraph Isomorphism Algorithm," ACM Design Automation Conf., Dallas, Tex. (1993).

The recognition rules 2 (parameterized pattern library) are generated using netlists, parameters derived from a standard-cell library, or list of layout generators. Typically, some generalization to permit instance properties to be derived from matched elements is required. For example, "PW" and "NW" properties on the nested schematic are derived from the widths of specific transistors that match the topology pattern. The pattern schematic provides expressions that describe this calculation as the PW and NW properties. Each cell in the standard-cell library is a set of discrete logic functions that can be implemented in mask form. Cells from the cell library are selected to serve as building blocks in constructing an IC. Each cell has an associated cell layout and associated information regarding performance characteristics of the cell; for example, power consumption, speed, etc. For very large scale integration (VLSI) fabrication, a cell-level netlist, a timing specification, and performance characteristics information are used in selecting cells from the cell library.

When using a standard-cell library as recognition rules for the parameterized pattern library for a schematic-driven layout generation, the recognition rules can include elements of a standard-cell library that consists of a layout without variation, wherein a standard-cell has no formal parameters. Layout generators that can be applied with variation (thus has parameters on its symbol) is generally a layout generator, or "parameterized cell" that can be effectuated by VLSI-CAD tools made by Cadence of Santa Clara, Calif. In other words, the library used with the invention includes as many layout generators as required that accommodate input parameters. By varying these input parameters, the invention varies the operation of the layout generators within the parameterized library to change the layout of the cell that is generated to accommodate the logic and other design requirements (timing, capacitance, etc.).

Thus, when using an optional standard-cell library alone, pattern derivation devolves to creation of a matching criteria only, and renesting is direct substitution without application of derivation rules, in which a single generator can be used for situations with variation. However, a more generalized aspect of the invention includes use of derivation rules to account for variability in which a typical pattern library has the following features. For each generatable element, there is a symbol with formal parameters. The values assigned to these parameters in a design layout will be used as inputs to the layout generator and used by the pattern recognizer. For each element, there is a netlist that is made up of named sub-elements with properties and a topology of electrical connections. Each property on a named sub-element is defined as a mathematical function (e.g., an algebraic expression ax+b*c) of the formal parameters for the generatable element.

The netlist 1 is a file or other set of specifications which defines the topological and logical structure of the circuit by listing connections between input and output ports of various cells from the standard-cell library.

The recognition rules (pattern library) 2 for renesting of components includes rules that consider each pattern, and provide a mechanism of identifying and matching netlist topologies. Another rule governs a set of constraints (boolean expressions) over the properties of matched elements, as discussed below and shown as part of a schematic sub-graph recognizer (pattern recognizer) 3. Yet another rule provides a set of expressions for deriving parameters on the elements to be inserted in place of the matched pattern by the renesting action (renester) 4.

Also included with the pattern library 2 are mechanisms for deriving elements necessary for the pattern library 2 from a schematic-driven cell library. One matching pattern is derived from each element in the library. The netlist topology of the element is used as an example based topology match. This creates a hypothesized association of named elements in the pattern with elements in the design being matched. Generation of the parameterized pattern library 2 includes the following.

Selecting a list of layout generators that are to be used (example: inverter takes three parameters (pn, pw, 1). For each layout generator, the invention inputs a schematic pattern describing a flattening rule for generating a transistor level netlist pattern element (NAND, inverter, MUX, etc.). The pattern consisting of a netlist topology (wiring connections etc.) and parameters (e.g., PW) for the nodes (e.g., transistors) of the netlist. The netlist are used for calculating mathematical expressions of the parameters of each of the layout generators used. From this pattern, a matching criteria (MC) is calculated (e.g., required "p/n" type transistor ratios, equality between different parameters, min/max bounds on parameters). Also from this pattern, parameter derivation rules are then calculated (e.g., generator parameter PW=parameter "w" of transistor that matches node "P" in pattern topology). The recognition pattern used by the recognizer 3 for this selected generator includes the required topology together with the associated matching criteria (MC) for this layout generator.

The "renesting" by the renester 4 includes (given those topological sub-graphs which match the required topology and pass the matching criteria (MC)) substituting the recognized sub-graph with a node representing the selected generator, with calculated parameters using the associated parameter derivation rules that are the inverse of the MC rules.

Figure 2:
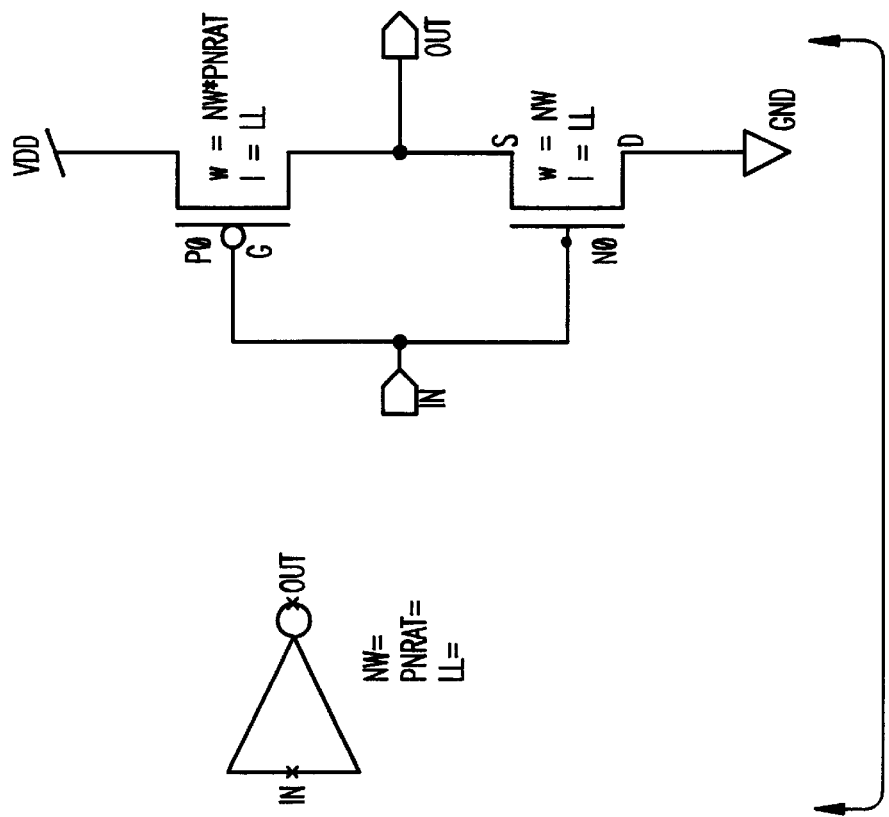
FIG. 2 is a schematic representation of an inverter as an example to illustrate use of the invention.
Figure 3:
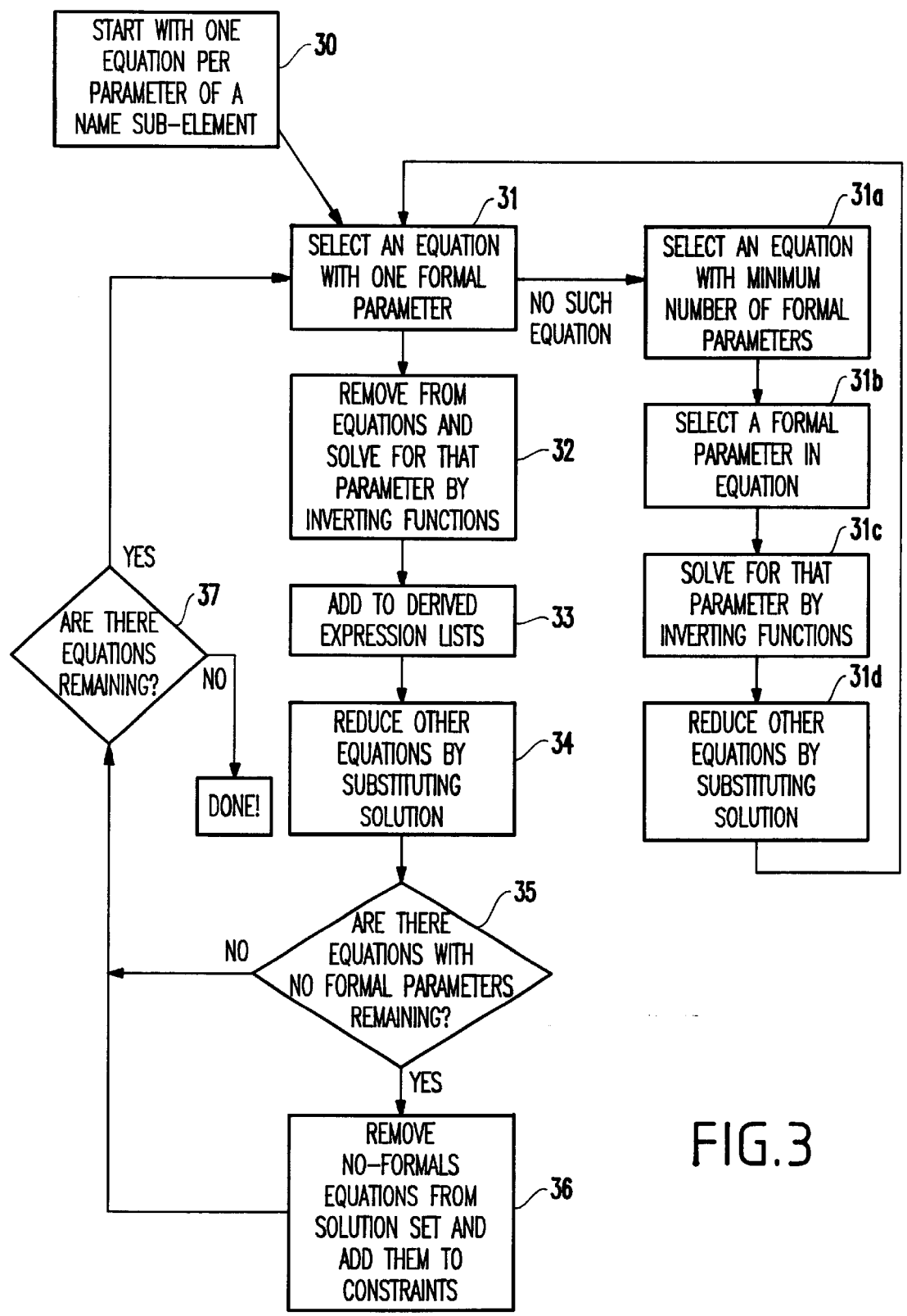
FIG. 3 is a flow diagram of an exemplary method for generating equations of a parameter used for associations by a pattern recognizer shown in FIG. 1.

Constraints and derivation expressions of the set of constraints (boolean expressions) of matched elements are derived from the sub-element properties using standard algebraic manipulation techniques. To illustrate the invention for generating the recognition rules (parameterized pattern library), FIG. 2 is provided showing an inverter. FIG. 3 shows a flow diagram for implementing the invention.

Referring now to FIG. 2, the inverter as shown is represented by a symbol having two ports (IN, OUT) and three formal parameters, NW, LL, and PNRAT. Note that NW=width of an nfet device, LL=length of transistors, PNRAT=ratio of pfet device width to nfet device width. This schematic contains two named sub-components, N0 and P0 that each have two parameters, w and 1, which correspond to device width and length, respectively.

Referring now to FIG. 3, an exemplary form of generating a pattern library is providing by inverting a set of expressions. Note that this example is illustrative, and not exclusive as to other forms of generating a parameterized pattern library. For example, other forms of generating this pattern library include similar logical related expressions that include linear formulae, wherein a matrix inversion operation can be applied.

To use the example of FIG. 2, equation constraints are derived, wherein the process is initialized at step 30 where one equation per parameter of a named sub-element is determined. At step 31, selection of an equation with only one formal parameter is performed. If there are no such equations, the process goes to steps 31a–31d. At step 31a, selection is made of an equation with the minimum number of formal parameters. Next at step 31b, a selection of formal parameters in the equation is made. Then at step 31c, a determination of parameters is made by inverting the function. Then at step 31d, a reduction of other equations by substitution of a solution is made. These steps are iterative until there is such an equation with one formal parameter.

At step 31, selection of an equation with one formal parameter is performed. As an example and using the following equations: N0.w=NW wherein:

| | | |
|---|---|---|
| N0.1 = LL | | (1) |
| P0.w = NW*PNRAT | | (2) |
| P0.1 = LL | | (3) |

As an example, equation N0.w=NW is selected. Inversion (step 32) leads to NW=N0.w, which is added to the derived expression (parameter) lists in step 33. After reduction of other equations by substituting solution (step 34), the equations are: N0.1=LL.

$$PO\text{-}w = NO.W*PNRAT \quad (4)$$
$$PO.1 = LL \quad (5)$$

Returning to step 31, equation NO.I=LL is selected, and the reduction at step 34 is repeated, resulting in a derivation LL=NO.I, and a new set of equations:

$$PO.w = NO.W*PNRAT \quad (6)$$
$$PO.1 = NO.1 \quad (7)$$

The second equation triggers condition 35 determining whether there are equations with no formal parameters remaining, and it is converted to a constraint equation in step 36 by removing no-formal equations from a solution set and adding them as other constraints. The remaining equation PO.w=NO.w*PNRAT is inverted to create a derivation PNRAT=PO.w/NO.w. The final equation constraint is:

$$PO.1 = NO.1 \quad (8)$$

while the derivations are:

$$NW = NO.w \quad (9)$$
$$LL = NO.1 \quad (10)$$
$$PNRAT = PO.w/NO.w \quad (11)$$

In more complicated designs, the method continues at step 37 that determines whether there are more equations remaining. If not, the processing for a cell is completed, and the process repeats itself beginning at step 31.

Next, renesting of the netlist 1 by the renester 4 occurs using the list of associations generated by the pattern recognizer 3. This list of associations consists of pairings of elements of the pattern netlist with elements of the input netlist indicating what parts of the input netlist correspond to the pattern (e.g., what transistor in the input corresponds to what transistor in the pattern, what net in the input corresponds to what net in the pattern, etc). This association is a standard output of the algorithms cited for pattern-matching as discussed above. These associations are used to derive the inputs to the derivation rules for calculation of actual parameters.

The hierarchical layout method includes a pattern recognizer (schematic-cell driven sub-graph recognizer) 3 that creates a list of associations between the pattern library 2 and the design netlist 1. This step is well known and is disclosed in the teaching "SubGemini: Identifying SubCircuits Using a Fast Subgraph Isomorphism Algorithm," ACM Design Automation Conf., Dallas, Tex. (1993).

The invention applies a set of schematic sub-graph recognition rules, (e.g. pattern matching rules, derivation rules, logical analysis) to create an intermediate "renested" schematic to direct the layout generation system 6. An extension of the pattern recognizer provides "near-miss" matching (for example, a custom schematic that matched an existing standard-cell library within a certain tolerance is recognized). Then, either an analysis tool or the designer decides whether it is acceptable to modify the schematic to match the existing layout or, alternately, whether the existing layout can be modified to match the schematic using existing layout migration tools.

The renester 4 modifies the design netlist in place, or annotates it with grouping constructs rather than creating a new netlist. Alternatively, renesting, items can be 'marked' with a property that binds them into a group. For example, an n-channel transistor and a p-channel transistor can both be marked with a property that states that "this transistor is part of inverter 1." This reduces the need for consistency maintenance in an incremental environment and provide benefits in terms of the ability to post-edit the pattern selection, resulting in the potential for introduction of errors in the translation step and may be prevented by methodology constraints (e.g., where the design netlist needs to be flat for analysis or integration purposes).

The final layout structure netlist 5 is outputted as a hierarchical layout to the layout generation system 6 as an intermediate netlist. Further iterations occur as to routing and compaction of the IC design for a final design for creating masks to create the actual IC chip.

The invention can be used in an exact pattern matching method and used with a circuit family recognition technique using, for example an ECAD tool ARCTIC made by Cadmos, Inc., Mountain View, Calif. This tool allows for layout techniques that are applied to an entire logic circuit family. For example, Echk circuit family recognition can be used to recognize footed-domino circuits, resulting in a building block-type dynamic circuit layout technique.

Renesting the schematic netlist 1 using the parameterized pattern library 2 allows for much greater productivity in layout generation as compared to manual transistor-level layout methods in current use. The library 2 also facilitates revision of the layout that frequently occurs in response to functional or performance tuning. Additionally, use of the concepts presented by the library 2 can be used for eventual migration of the design to subsequent generations of VLSI technology (e.g., from a 0.25 um process to a 0.18 um process). Other application of the invention include use in technology migration. An existing design of arbitrary construction in one technology can be extracted to a transistor level netlist using standard VLSI (e.g., Cadence LPR tool). The invention can then be used to renest the schematic to facilitate re-layout using this application.

Figure 4:
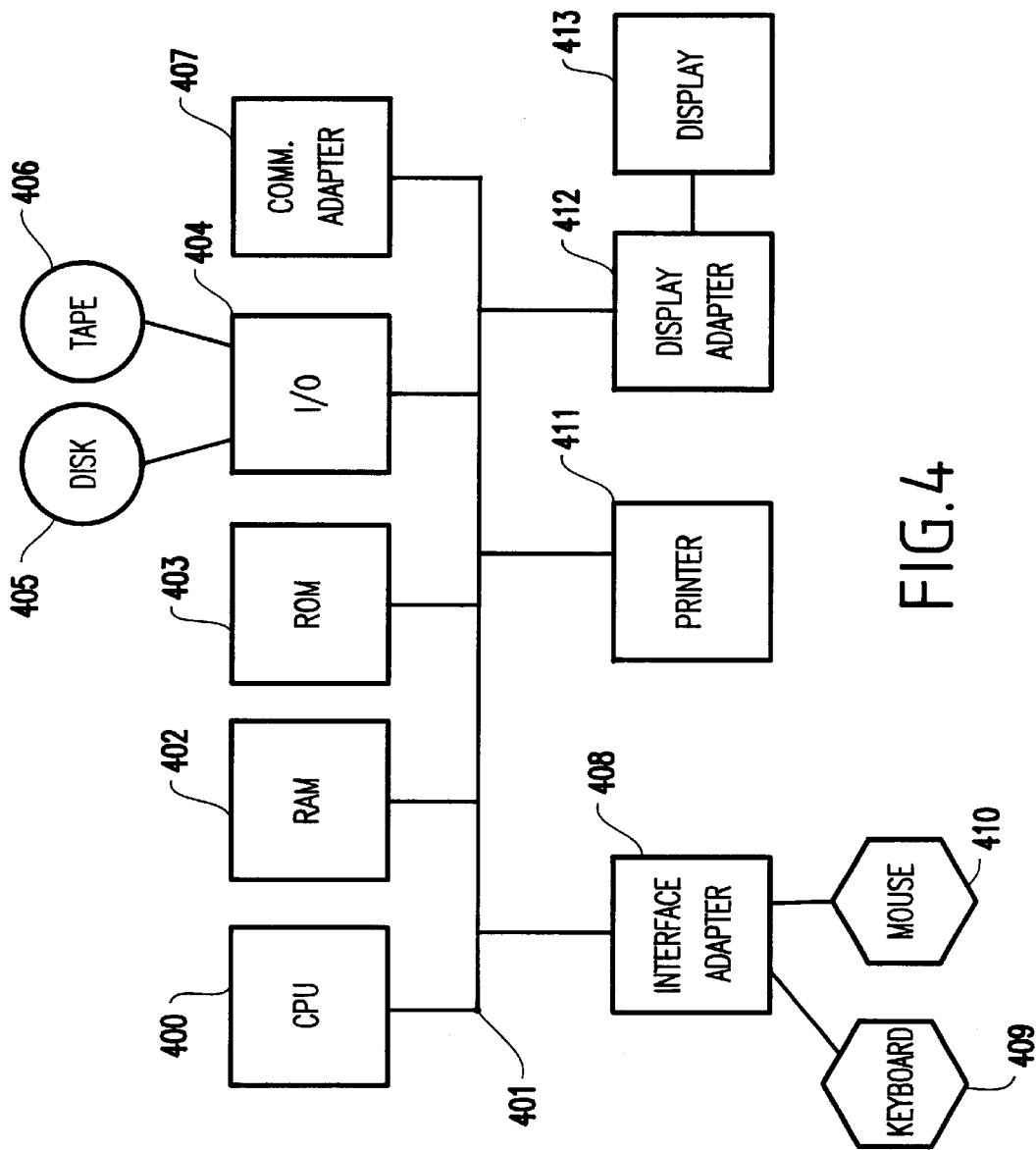
FIG. 4 is a schematic diagram of a hardware embodiment of the invention.

While the method of the invention is provided above, the invention can be embodied in any number of different types of systems and executed in any number of different ways, as would be known by one ordinarily skilled in the art. For example, as illustrated in FIG. 4, a typical hardware configuration of an information handling/computer system in accordance with the invention to implement the method of the invention, preferably has at least one processor or central processing unit (CPU) 400. For example, the central processing unit 400 could include various mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, filtering, adding, subtracting, comparing, etc.

The CPU 400 is interconnected via a system bus 401 to a random access memory (RAM) 402, read-only memory (ROM) 403, input/output (I/O) adapter 404 (for connecting peripheral devices such as disk units 405 and tape drives 406 to the bus 401), communication adapter 407 (for connecting an information handling system to a data processing network) user interface adapter 408 (for connecting peripherals 409–410 such as a keyboard, mouse, microphone, speaker and/or other interface device to the bus 401), a printer 411, and display adapter 412 (for connecting the bus 401 to a display device 413). The invention could be implemented using the structure shown in FIG. 4 by including the inventive method, described above, within a computer program stored on the storage device 405. Such a computer program would act on input supplied through the interface units 409–410 or through the network connection 407. The system would then automatically perform the foregoing processing and produce output on the same on the display 413, through the printer 411 or back to the network 407.

Using the foregoing specification, the invention may be implemented via standard programming and/or engineering techniques. The resulting program(s) may be stored on disk, diskettes, memory cards, read-only-memory or any other memory device. For execution, the program(s) may be copied into the system memory random access memory associated with the processor. One skilled in the art of computer science will readily be able to combine the software created as described with appropriate general purpose or special purpose computer hardware to create a computer system embodying the invention.

Renesting the schematic netlist 1 by the pattern recognizer 3 using an initially created parameterized pattern library 2 enables greater productivity in layout generation. The invention also facilitates revisions of the layout that frequently occur in response to functional or performance tuning where iterations of a preliminary design are done. In addition, the invention aids the eventual migration of a design to subsequent generation of VLSI technology.

Therefore, as mentioned above, the invention provides an automated, non-manual process/system that reviews the flat, non-hierarchical design to determine if it can match portions of the flat design to known groups of elements contained in a parameterized pattern library 2. Further, an important feature of the invention is that the parameterized pattern library 2 is generated without knowledge of the specific circuits that will be nested. To generate such a library, the invention creates unique reverse derivation rules for each group of elements that are used by each parameterized layout generator (each layout generator is specific to a logic unit, such as AND, OR, etc.). The invention formulates mathematical expressions (based on the layout generators parameters) that the layout generator would use when "flattening" (e.g., eliminating the hierarchy) a logic unit (AND, OR etc.) into an actual physical layout. The invention then inverts these mathematical expressions to allow the library to be used to identify higher level logical units from a flat schematic layout.

Applicability of the present invention is not limited to generation of IC layout design alone, but can also be used in manipulation of any hierarchical data with pattern matching constraints. In particular, the invention is applicable to manipulating any net and device instance paths in physical and logical designs. This may be generalized to the manipulation of any entity computed at a node in a design space. Additional applicability of the invention extends to direct mapping between the design model of VLSI and those of two-three dimensional computer aided design programs or computer aided manufacturing programs.

While the invention has been particularly described and illustrated with reference to a preferred embodiment, it will be understood by those skilled in the art that changes in the description or illustrations may be made with respect to form or detail without departing from the spirit and scope of the invention.

What is claimed is:

1. A method for creating a parameterized pattern library for a hierarchical layout of an electronic design, said method comprising:

selecting at least one layout generator;

creating rules for generating a layout netlist for a specific instance of each layout generator, said rules comprising a topology and node parameters of said layout netlist, said node parameters being calculated as mathematical expressions of netlist parameters of said layout netlist; and calculating matching criteria and parameter derivation rules from said rules.

2. The method of claim 1, wherein said rules comprise flattening rules for generating a transistor level netlist, wherein said transistor level netlist comprises wiring connections and location of nodes of said transistor level netlist.

3. The method of claim 1, wherein said matching criteria includes required "p/n" type transistor ratios, equality between different said parameters, and a minimum and maximum bounds on said parameters.

4. The method of claim 1, wherein said parameter derivation rules comprise an inversion parameter of said matching criteria.

5. A computer implemented design method for hierarchical layout of an electronic design, the method comprising:

generating a parameterized pattern library;

inputting a netlist into a pattern recognizer;

creating a list of associations between said pattern library and said netlist using said pattern recognizer; and renesting said netlist using said list of associations.

6. The method of claim 5, further comprising generating a hierarchical layout of said electronic design.

7. The method of claim 5, wherein said generating of said parameterized pattern library includes loading parameters used by said pattern recognizer, said parameters include:

a) for each pattern, identifying and matching said netlist;

b) a set of constraint equations over properties of matched elements; and c) a set of expressions for deriving parameters on said matched elements to be inserted in place of a matched pattern.

8. The method of claim 5, wherein said generating of said parameterized pattern library includes deriving elements for a schematic-driven layout generation, said elements include parameters comprising:

a) an element netlist for each said element, said element netlist includes named sub-elements having properties and topology of electrical connections; and b) each said property on each said sub-element is defined as a mathematical function for each of said derived elements.

9. The method of claim 8, wherein said property of said sub-element is derived starting from a set of equations with one formal parameter wherein said derivation includes:

selecting an equation with one formal parameter;

removing from said set of equations and solve for said one formal parameter by equation inversion;

adding to a derived parameter list;

reducing said set of equations; and determining whether unselected equations with no formal parameters remain, and removing said unselected equations with no-formal parameters from a solution set of equations and add to a list of constraint equations if there are remaining said unselected equations, and if not, then determining whether there are any equations remaining from said set of equations with one formal parameter.

10. The method of claim 9, wherein said selecting of an equation with one formal parameter further includes:
    determining whether said equation with one formal parameter exist,
    if no said equation with one formal parameter exist, the method further comprises:
    a) selecting an equation with minimum number of formal parameters;
    b) selecting a formal parameter in said equation in a);
    c) solving for said parameter in a) by inverting functions; and
    d) reducing said set of equations by substituting said solution.

11. A computer implemented design method for hierarchical layout of an electronic design, the method comprising:
    generating a parameterized pattern library;
    inputting a netlist into a pattern recognizer;
    creating a list of associations between said pattern library and said netlist using said pattern recognizer; and
    renesting said netlist using said list of associations,
    wherein said creating of said parameterized pattern library comprises selecting and loading a list of layout generators, wherein each layout generator comprises:
        creating rules of a schematic pattern for generating a generator layout netlist for a specific instance of said layout generator, said schematic pattern comprising a netlist topology and parameters for nodes of said generator layout netlist calculated as mathematical expressions of said parameters of said generator layout;
        calculating a matching criteria from said pattern schematic, and parameter derivation rules, wherein said pattern recognizer for said layout generator is created for a required topology with said matching criteria.

12. The method of claim 11, wherein said step of renesting includes:
    creating renesting subgraphs that match said required topology and accepted by said matching criteria; and substituting each said renesting subgraph with a node represented by each said layout generator, with parameters calculated using said parameter derivation rules.

13. A system for designing a hierarchical layout of an electronic design forming part of an electronic computer, said system comprising:
    a parameterized pattern library generator;
    a pattern recognizer operably connected to said parameterized pattern library generator; and
    a renester, whereby said parameterized pattern library generator creates parameters used to form a list of associations between a netlist and said patent recognizer.

14. The system of claim 13, further comprising a generator of a hierarchical layout of said electronic design, said generator is operably connected to said renester.

15. The system of claim 13, wherein said parameterized pattern library includes a memory for storing parameters used by said pattern recognizer, said parameters include:
    a) for each pattern, identifying and matching said netlist;
    b) a set of constraint equations over properties of said matched elements; and
    c) a set of expressions for deriving parameters on said matched elements to be inserted in place afraid matched pattern.

16. A system for designing a hierarchical layout of an electronic design forming part of an electronic computer, said system comprising:
    a parameterized pattern library;
    a pattern recognizer operably connected to said parameterized pattern library; and
    a renester, whereby said parameterized pattern library creates parameters used to form a list of associations between a netlist and said pattern recognizer,
    wherein said parameterized pattern library and said pattern recognizer comprise a portion of said electronic computer for enabling a method for selecting and loading a list of layout generators, wherein each said layout generator executes instructions that include:
        creating rules of a schematic pattern for generating a generator layout netlist for a specific instance of said layout generator, said schematic pattern comprising a netlist topology and parameters for nodes of said generator layout netlist calculated as mathematical expressions of said parameters of said generator layout;
        calculating a matching criteria from said pattern schematic, and parameter derivation rules, wherein said pattern recognizer for said layout generator is created for a required topology with said matching criteria.

17. The system of claim 16, wherein said renester comprises a portion of said central processing unit for creating renesting subgraphs that match said required topology and accepted by said matching criteria; and substituting each said renesting subgraph with a node represented by each said layout generator, with parameters calculated using said parameter derivation rules.

18. A system for designing a hierarchical layout of an electronic design forming part of an electronic computer, said system comprising:
    a parameterized pattern library;
    a pattern recognizer operably connected to said parameterized pattern library; and
    a renester, whereby said parameterized pattern library creates parameters used to form a list of associations between a netlist and said pattern recognizer,
    wherein said pattern library includes elements derived for a schematic-driven layout generator, said elements include parameters comprising:
        a) an element netlist for each said element, said element netlist includes named sub-elements having properties and topology of electrical connections; and
        b) each said property on each said sub-element is defined as a mathematical function for each of said derived elements.

19. The system of claim 18, wherein said property of said sub-element is derived starting from a set of equations with one formal parameter, wherein said derivational method includes:
    selecting an equation with one formal parameter;
    removing from said set of equations and solve for said one formal parameter by equation inversion;
    adding to a derived parameter list;
    reducing said set of equations; and
    determining whether unselected equations with no formal parameters remain, and removing said unselected equations with no-formal parameters from a solution set of equations and add to a list of constraint equations if there are remaining said unselected equations, and if not, then determining whether there are any equations remaining from said set of equations with one formal parameter.

20. The system of claim 19, wherein said derivational method as to selecting an equation with one formal parameter further includes:
   determining whether said equation with one formal parameter exist,
   if no said equation with one formal parameter exist, the method further comprises:
   a) selecting an equation with minimum number of formal parameters;
   b) selecting a formal parameter in said equation in a);
   c) solving for said parameter in a) by inverting functions; and
   d) reducing said set of equations by substituting said solution.

21. A program storage device readable by a computer system, tangibly embodying a program of instructions executable by said system to perform a method for design of a hierarchical layout of an electronic design forming part of an electronic computer aided design system, said method comprising:
   generating a parameterized pattern library;
   inputting said parameterized pattern library and a netlist into a pattern recognizer;
   creating a list of associations between said pattern library and said netlist using said pattern recognizer; and
   renesting said netlist using said list of associations.

22. The program storage device of claim 21, further comprising generating a hierarchical layout of said electronic design.

23. The program storage device of claim 21, wherein said inputting of said pattern library includes loading parameters used by said pattern recognizer, said parameters include:
   a) for each pattern, identifying and matching said netlist;
   b) a set of constraint equations over properties of said matched elements; and
   c) a set of expressions for deriving parameters on said matched elements to be inserted in place of said matched pattern.

24. A program storage device readable by a computer system, tangibly embodying a program of instructions executable by said system to perform a method for design of a hierarchical layout of an electronic design forming part of an electronic computer aided design system, said method comprising:
   inputting a parameterized pattern library and a netlist into a pattern recognizer;
   creating a list of associations between said pattern library and said netlist using said pattern recognizer; and
   renesting said netlist using said list of associations,
   wherein said inputting of said parameterized pattern library and said pattern recognizer comprises selecting and loading a list of layout generators, wherein each said layout generator comprises:
      creating rules of a pattern schematic for generating a generator layout netlist for a specific instance of said layout generator, said schematic pattern comprising a netlist topology and parameters for nodes of said generator layout netlist calculated as mathematical expressions of said parameters of said generator layout;
      calculating a matching criteria from said pattern schematic, and parameter derivation rules, wherein said pattern recognizer for said layout generator is created for a required topology with said matching criteria.

25. The program storage device of claim 24, wherein said step of renesting includes:
   creating renesting subgraphs that match said required topology and accepted by said matching criteria; and
   substituting each said renesting subgraph with a node represented by each said layout generator, with parameters calculated using said parameter derivation rules.

26. A program storage device readable by a computer system, tangibly embodying a program of instructions executable by said system to perform a method for design of a hierarchical layout of an electronic design forming part of an electronic computer aided design system, said method comprising:
   inputting a parameterized pattern library and a netlist into a pattern recognizer;
   creating a list of associations between said pattern library and said netlist using said pattern recognizer; and
   renesting said netlist using said list of associations,
   wherein said inputting of said pattern library includes deriving elements for a schematic-driven layout generation, said elements include parameters comprising:
   a) an element netlist for each said element, said element netlist includes named sub-elements having properties and topology of electrical connections; and
   b) each said property on each said sub-element is defined as a mathematical function for each of said derived elements.

27. The program storage device of claim 26, wherein said property of said sub-element is derived starting from a set of equations with one formal parameter wherein said derivation includes:
   selecting an equation with one formal parameter;
   removing from said set of equations and solve for said one formal parameter by equation inversion;
   adding to a derived parameter list;
   reducing said set of equations; and
   determining whether unselected equations with no formal parameters remain, and removing said unselected equations with no-formal parameters from a solution set of equations and add to a list of constraint equations if there are remaining said unselected equations, and if not, then determining whether there are any equations remaining from said set of equations with one formal parameter.

28. The program storage device of claim 27, wherein said selecting of an equation with one formal parameter further includes:
   determining whether said equation with one formal parameter exist,
   if no said equation with one formal parameter exist, the method further comprises:
   a) selecting an equation with minimum number of formal parameters;
   b) selecting a formal parameter in said equation in a);
   c) solving for said parameter in a) by inverting functions; and
   d) reducing said set of equations by substituting said solution.

* * * * *